United States Patent
Kim et al.

(10) Patent No.: US 10,833,706 B2
(45) Date of Patent: Nov. 10, 2020

(54) POLAR ENCODING AND DECODING USING PREDEFINED INFORMATION

(71) Applicant: Samsung Electronics Co., Ltd., Suwon-si, Gyeonggi-do (KR)

(72) Inventors: Dae-son Kim, Seoul (KR); Min-goo Kim, Hwaseong-si (KR); Se-hyoung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 154 days.

(21) Appl. No.: 16/001,275

(22) Filed: Jun. 6, 2018

(65) Prior Publication Data

US 2018/0358985 A1    Dec. 13, 2018

(30) Foreign Application Priority Data

Jun. 8, 2017   (KR) .................. 10-2017-0071888
Dec. 27, 2017  (KR) .................. 10-2017-0181521

(51) Int. Cl.
*H03M 13/15*     (2006.01)
*H03M 13/00*     (2006.01)
(Continued)

(52) U.S. Cl.
CPC ........... *H03M 13/15* (2013.01); *H03M 13/09* (2013.01); *H03M 13/13* (2013.01); *H03M 13/27* (2013.01); *H03M 13/2792* (2013.01); *H03M 13/2906* (2013.01); *H03M 13/2927* (2013.01); *H03M 13/6362* (2013.01)

(58) Field of Classification Search
CPC .. H03M 13/15; H03M 13/2906; H03M 13/13; H03M 13/27; H03M 13/6362; H03M 13/2927; H03M 13/2792; H03M 13/09
See application file for complete search history.

(56) References Cited

U.S. PATENT DOCUMENTS 8,913,686 B2   12/2014  Barron et al.
9,164,835 B2 * 10/2015  Lee .................... G06F 11/1068
(Continued)

FOREIGN PATENT DOCUMENTS

KR   10-1699749 B1   1/2017

OTHER PUBLICATIONS

E. Arikan, "Channel Polarization: A Method for Constructing Capacity-Achieving Codes for Symmetric Binary-Input Memoryless Channels," in IEEE Transactions on Information Theory, vol. 55, No. 7, pp. 3051-3073, Jul. 2009. (Year: 2009).*
Z. Chen-Yun and Z. Hong, "Character of Channel Polarization in Symmetric Binary-Input Discrete Memoryless Channel," 2016 International Symposium on Computer, Consumer and Control (IS3C), Xi'an, 2016, pp. 642-645. (Year: 2016).*
(Continued)

*Primary Examiner* — Cynthia Britt
(74) *Attorney, Agent, or Firm* — Harness, Dickey & Pierce, P.L.C.

(57) ABSTRACT

A method of encoding input data as a polar code includes generating unfrozen bits by adding at least one designated information bit to information bits which have been generated based on the input data, reordering the unfrozen bits and frozen bits by assigning the unfrozen bits to polarized sub-channels having higher reliability than the frozen bits having a value known to both of an encoder and a decoder, and generating a code word by polar-coding results of the reordering may be provided. The at least one designated information bit may have the value known to both the encoder and the decoder.

20 Claims, 12 Drawing Sheets

(51) Int. Cl.
*H03M 13/27* (2006.01)
*H03M 13/13* (2006.01)
*H03M 13/29* (2006.01)
*H03M 13/09* (2006.01)

(56) References Cited

U.S. PATENT DOCUMENTS

| | | |
|---|---|---|
| 9,176,927 B2 | 11/2015 | Gross et al. |
| 9,178,532 B2 | 11/2015 | Li et al. |
| 9,319,070 B2 | 4/2016 | Li et al. |
| 9,537,512 B2 | 1/2017 | Lorca Hemando |
| 2015/0222295 A1 | 8/2015 | Li et al. |
| 2015/0333775 A1 | 11/2015 | Korb et al. |
| 2015/0381208 A1 | 12/2015 | Li et al. |
| 2016/0013810 A1 | 1/2016 | Gross et al. |
| 2016/0056843 A1 | 2/2016 | Gross et al. |
| 2016/0079999 A1 | 3/2016 | Shen et al. |
| 2016/0308643 A1 | 10/2016 | Li et al. |
| 2017/0019214 A1* | 1/2017 | Shen .................... H03M 13/13 |
| 2017/0366199 A1* | 12/2017 | Ge ........................ H03M 13/09 |
| 2017/0366204 A1* | 12/2017 | Shi ........................ H03M 13/09 |
| 2018/0191465 A1* | 7/2018 | Saber .................... H04J 13/004 |
| 2018/0241414 A1* | 8/2018 | Gresset ................ H03M 13/13 |
| 2018/0351579 A1* | 12/2018 | Hong .................... H03M 13/13 |
| 2019/0349141 A1* | 11/2019 | Ahn ...................... H04L 1/1812 |
| 2019/0393987 A1* | 12/2019 | Hong .................. H03M 13/356 |
| 2020/0021393 A1* | 1/2020 | Noh ...................... H04L 1/0057 |
| 2020/0036476 A1* | 1/2020 | Yang ................ H03M 13/6362 |

OTHER PUBLICATIONS

Z. Wu and B. Lankl, "Polar Codes for Low-Complexity Forward Error Correction in Optical Access Networks," Photonic Networks; 15. ITG Symposium, Leipzig, Germany, 2014, pp. 1-8. (Year: 2014).*

P. Trifonov and V. Miloslavskaya, "Polar codes with dynamic frozen symbols and their decoding by directed search," 2013 IEEE Information Theory Workshop (ITW), Sevilla, 2013, pp. 1-5. (Year: 2013).*

I. Tal and A. Vardy, "List Decoding of Polar Codes," in IEEE Transactions on Information Theory, vol. 61, No. 5, pp. 2213-2226, May 2015 (Year: 2015).*

K. Niu and K. Chen, "CRC-Aided Decoding of Polar Codes," in IEEE Communications Letters, vol. 16, No. 10, pp. 1668-1671, Oct. 2012. (Year: 2012).*

K. Chen, B. Li, H. Shen, J. Jin and D. Tse, "Reduce the Complexity of List Decoding of Polar Codes by Tree-Pruning," in IEEE Communications Letters, vol. 20, No. 2, pp. 204-207, Feb. 2016 (Year: 2016).*

"Performance evialuation of polar code constructions.", 3GPP TSG RAN WG1 Meeting #89, May 15-19, 2017, Hangzhou, P.R. China.
"Early Termination Benefits of CRC Distribution.", 3GPP TSG RAN WG1 Meeting #89, May 15-19, 2017, Hangzhou, P.R. China.
"Polar codes design for UL control.", 3GPP TSG-RAN WG1#NR Ad-Hoc meeting, Jan. 16-20, 2017, Spokane, US.

* cited by examiner

```
11  I(e₀) = 0
12  k = 0
13  If(I(u_{1+log₂L}) > N/4)
14     for (i = 1;i ≤ j';i + +)
15        I(eᵢ) = I(eᵢ₋₁) + 2^{n-i}
16  Else
17     for (i = 1;i ≤ j';i + +)
18        I(eᵢ) = I(eᵢ₋₁) + 2^{[log₂I(eᵢ)]-k}
19        If(I(eᵢ) + 2^{[log₂I(eᵢ)]-k} > I(u_K))k + +
```

POLAR ENCODING AND DECODING USING PREDEFINED INFORMATION

CROSS-REFERENCE TO RELATED APPLICATIONS

This application claims priority under 35 U.S.C. § 119 to Korean Patent Application Nos. 10-2017-0071888, filed on Jun. 8, 2017 and 10-2017-0181521, filed on Dec. 27, 2017, in the Korean Intellectual Property Office, the disclosures of which are incorporated herein in their entireties by reference.

BACKGROUND

The inventive concepts relate to data encoding and decoding methods, and more particularly, to data encoding and decoding methods based on a polar code.

In a wireless communication system, channel encoding may be performed to improve reliability of data transmission. A polar code, which is one of the channel encoding schemes, may achieve Shannon capacity with low encoding/decoding complexity. The polar code uses channel polarization in which bit channels (or sub-channels) observed in an input are polarized as a good bit channel and a bad bit channel to transmit an information bit through the good bit channel while transmitting a frozen bit having a value (e.g., zero) known to both an encoder and a decoder through the bad bit channel.

SUMMARY

The inventive concepts provide a method and apparatus for polar encoding and decoding with improved efficiency by using predefined information.

According to an aspect of the inventive concepts, there is provided a method of encoding input data as a polar code including generating unfrozen bits by adding at least one designated information bit to information bits which have been generated based on the input data, reordering the unfrozen bits and frozen bits by assigning the unfrozen bits to polarized sub-channels having a higher reliability than the frozen bits having a value known to both of an encoder and a decoder; and generating a code word by polar-coding results of the reordering, wherein the at least one designated information bit may have the value known to both the encoder and the decoder.

According to another aspect of the inventive concepts, there is provided an apparatus for encoding input data as a polar code including a memory configured to store computer-readable instructions, and one or more processors configured to execute the computer-readable instructions such that the one or more processors are configured to generate a bit sequence by reordering unfrozen bits and frozen bits having a value known to both of an encoder and a decoder, based on reliability of polarized sub-channels, the unfrozen bits including at least one designated information bit and information bits based on the input data, and generate a code word by polar-coding the bit sequence, wherein the at least one designated information bit has the value known to both the encoder and the decoder.

According to another aspect of the inventive concepts, there is provided a decoding method including receiving a code word generated by polar encoding a bit sequence; and performing list decoding of the code word by generating a list of L decoding paths in a case where L is a positive integer, wherein the bit sequence includes unfrozen bits including input bits, cyclic redundancy check (CRC) bits, and at least one designated information bit, and frozen bits having values known to both of an encoder and a decoder, and wherein the performing includes early terminating decoding of the code word based on a result of decoding the at least one designated information bit.

DETAILED DESCRIPTION

Figure 1:
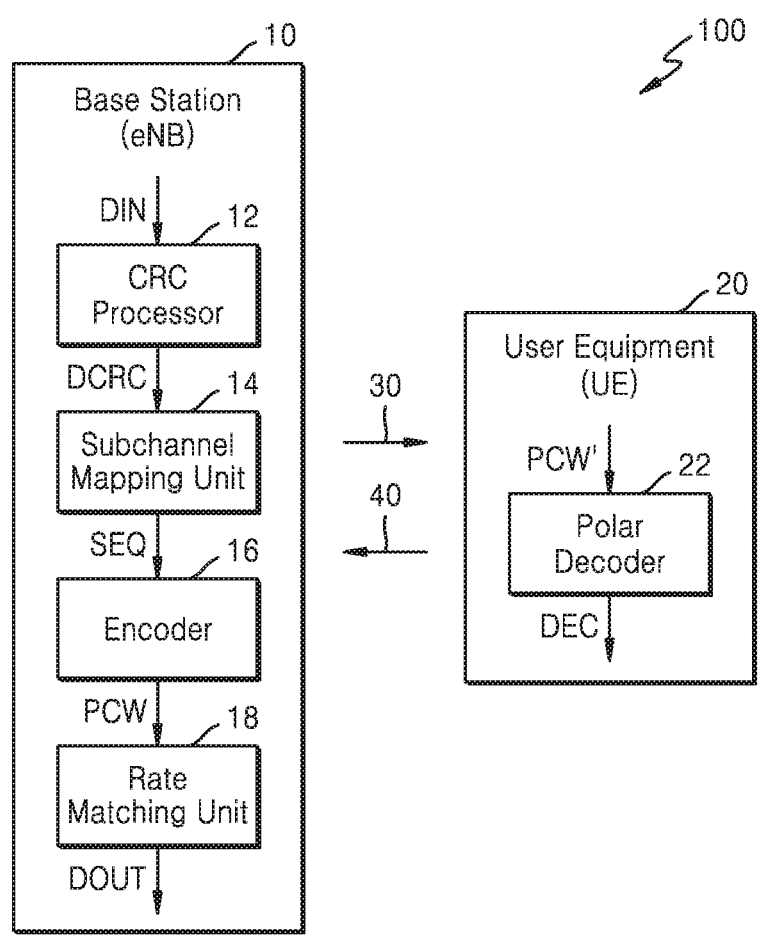
FIG. 1 is a block diagram illustrating a wireless communication system including a base station and user equipment in accordance with an example embodiment of the inventive concepts.

FIG. 1 is a block diagram illustrating a wireless communication system 100 including a base station (BS or eNB) 10 and user equipment (UE) 20 in accordance with an example embodiment of the inventive concepts. The wireless communication system 100 may include, but is not limited to, a 5th generation (5G) wireless system, a Long Term Evolution (LTE) system, a Code Division Multiple Access (CDMA) system, a Global System for Mobile Communications (GSM) system, a Wireless Local Area Network (WLAN) system, or any other wireless communication system.

The BS 10 may be a fixed station that may communicate with the UE 20 and/or other BS and to exchange data and control information. For example, the BS 10 may be referred to as a Node B, an evolved Node B (eNB), a sector, a site, a Base Transceiver System (BTS), an Access Pint (AP), a Relay Node, Remote Radio Head (RRH), a radio unit (RU), a small cell, or the like. In the present disclosure, the BS 10 or cell may indicate some areas or functions covered by a Base Station Controller (BSC) in CDMA, Node-B in WCDMA, eNB in LTE or a sector (a site), and may include various coverage areas such as megacell, macrocell, microcell, picocell, femtocell and relay node, RRH, RU, or small cell communication range.

The UE 20, which is a wireless communication device, may include various devices that may be fixed or mobile and may communicate with the BS 10 to transmit and receive data and/or control information. For example, the UE 20 may be terminal equipment, a mobile station (MS), a mobile terminal (MT), a user terminal (UT), a subscriber station (SS), a wireless device, a handheld device, or the like.

A wireless communication network between the BS 10 and the UE 20 may support communication of multiple users by sharing available network resources. For example, in the wireless communication network, information may be transferred through various multiple access methods such as a code division multiple access (CDMA), a frequency division multiple access (FDMA), a time division multiple access (TDMA), an orthogonal frequency division multiple access (OFDMA), Single Carrier Frequency Division Multiple Access (SC-FDMA), OFDM-FDMA, OFDM-TDMA, or OFDM-CDMA Referring to FIG. 1, the BS 10 and the UE 20 may communicate with each other through a downlink (DL) 30 and an uplink (UL) 40. For example, in a wireless system such as an LTE system or an LTE-Advanced system, the DL 30 and the UL 40 may transmit control information through a control channel such as a Physical Downlink Control Channel (PDCCH), a Physical Control Format Indicator Channel (PCFICH), a Physical Hybrid ARQ Indicator Channel (PHICH), a Physical Uplink Control Channel (PUCCH), or an Enhanced Physical Downlink Control Channel (EPDCCH), and may transmit data through a data channel such as a Physical Downlink Shared Channel (PDSCH), or a Physical Uplink Shared Channel (PUSCH).

In the present disclosure, transmitting and receiving a signal through a physical control channel such as the PUCCH, the PUSCH, the PDCCH, the EPDCCH, or the PDSCH may be expressed as "transmitting and receiving the PUCCH, the PUSCH, the PDCCH, the EPDCCH and the PDSCH". Also, transmitting or receiving the PDCCH or transmitting or receiving a signal through the PDCCH may include transmitting or receiving the EPDCCH or transmitting or receiving the signal through the EPDCCH. That is, the PDCCH may be the PDCCH or the EPDCCH, and may include both the PDCCH and the EPDCCH.

Channel encoding may be used to improve reliability of data transmission through the DL 30 and the UL 40 in the wireless communication system 100. For example, in the wireless communication system 100, a polar code (or a polar sign) may be used for channel encoding, and the BS 10 and UE 20 may include an encoder and decoder for the polar code, respectively. The polar code may be based on channel polarization by which bit channels (or sub-channels) observed in an input are polarized as good and bad bit channels. Thus, in the polar code, information bits based on input data DIN may be assigned to the good bit channel, while frozen bits having values known to both the encoder and decoder may be assigned to the bad bit channel. As described below, according to some example embodiments of the inventive concepts, at least one designated information (interchangeably referred to as predefined information (PI)) bit having a predefined or desired value may be additionally assigned to the good bit channel of the polar code. In some example embodiments, the PI bit may include the values known to both the encoder and decoder (e.g., a predefined or desired fixed value and/or an identifier of the UE 20), and may be assigned to an index corresponding to the good bit channel in a bit sequence SEQ that is an input of an encoder 16 determined based on a characteristic of the polar code.

Encoding and decoding apparatuses and/or methods according to some example embodiments of the inventive concepts may enable early termination of a polar code decoding operation by using designated information in encoding and decoding of the polar code, and thus may significantly reduce load (e.g., computing resources) for a decoding operation in the wireless communication system 100 owing to the efficient early termination. Encoding and decoding apparatuses and methods according to some other example embodiments of the inventive concepts may obtain a desired false alarm rate (FAR) without an additional cyclic redundancy check (CRC) bit by using designated information, while providing improved decoding performance by early discarding of a decoding path during the decoding operation.

Referring to FIG. 1, the BS 10 may include a CRC processor 12, a sub-channel mapping unit 14, an encoder 16, and a rate matching unit 18. The UE 20 may include a polar decoder 22. Hereinafter, examples in which the BS 10 encodes data during a process of transmitting a signal to the UE 20 through the DL 30 and the UE 20 decodes the data during a process of receiving the signal from the BS 10 through the DL 30 are described. However, example embodiments are not limited thereto. According to some example embodiments, the UE 20 may transmit the signal to the BS 10 through the UL 40 and the BS 10 may receive the signal from the UE 20 through the UL 40. For example, although not shown in FIG. 1, the BS 10 may include a polar decoder, and the UE 20 may include a polar encoder. The components of BS 10 and UE 20 may be implemented as hardware blocks implemented through logic synthesis or the like in some example embodiments, may be implemented as a processor and software blocks implemented by the processor in some example embodiments, and may be implemented as a combination of hardware blocks, the processor, and the software blocks in some example embodiments.

The CRC processor 12 may generate cyclic redundancy check (CRC) bits of input data DIN, and generate CRC data DCRC including the input data DIN and the CRC bits. For example, the CRC processor 12 may generate CRC data DCRC of (K+J) bits by adding CRC bits of J bits to input data DIN of K bits (K and J are positive integers). In the present disclosure, the CRC data DCRC may be referred to as information bits including input bits and CRC bits of the input data DIN. The CRC bits may be used to confirm if there is an error in data received in the UE 20, and the CRC processor 12 may generate the CRC bits in any manner desired by the wireless communication system 100. In some example embodiments, the CRC bits may be masked with a Radio Network Temporary Identifier (RNTI), as described below with reference to FIG. 2.

The sub-channel mapping unit 14 may generate a bit sequence SEQ, which is an input to the encoder 16, from the CRC data DCRC. In some example embodiments, the sub-channel mapping unit 14 may generate unfrozen bits by adding at least one PI bit to the CRC data DCRC, and may generate the bit sequence SEQ by reordering the frozen bits and the unfrozen bits. For example, the sub-channel mapping unit 14 may generate unfrozen bits of (K+J+J') bits and may generate frozen bits of (N−(K+J+J')) bits by adding PI bits of J' bits to CRC data DCRC of (K+J) bits (J' and N are positive integers). Then, the sub-channel mapping unit 14 may generate bit sequence SEQ of N bits by reordering the unfrozen bits and the frozen bits.

The bit sequence SEQ is an input to the encoder 16 that generates a polar encoded code word PCW. Indices of the bit sequence SEQ may correspond to polarized sub-channels of a polar code. Accordingly, the sub-channel mapping unit 14 may recognize a good sub-channel (or a good bit channel) and a bad sub-channel (or a bad bit channel) based on the indices, and may generate the bit sequence SEQ by assigning unfrozen bits including frozen bits and the at least one PI bit to polarized sub-channels with higher reliability than the frozen bits. Thus, the at least one PI bit included in the unfrozen bits may be assigned to the polarized sub-channel having relatively high reliability. Some examples in which the bit sequence SEQ is generated from unfrozen bits and frozen bits will be described below with reference to FIGS. 6-9.

The encoder 16 may generate the polar encoded code word PCW by processing the bit sequence SEQ. For example, the encoder 16 may generate polar encoded code word PCW of N bits $x_1^N$ from bit sequence SEQ $u_1^N$ of N bits as shown in [Equation 1] below.

$$x_1^N = u_1^N G_N = u_1^N G_2^{\otimes n}$$ [Equation 1]

In [Equation 1], $G_N$ may be referred to as a generator matrix and may be an n-order Kronecker power of $$G_2 = \begin{bmatrix} 1 & 0 \\ 1 & 1 \end{bmatrix}.$$

Figure 4:
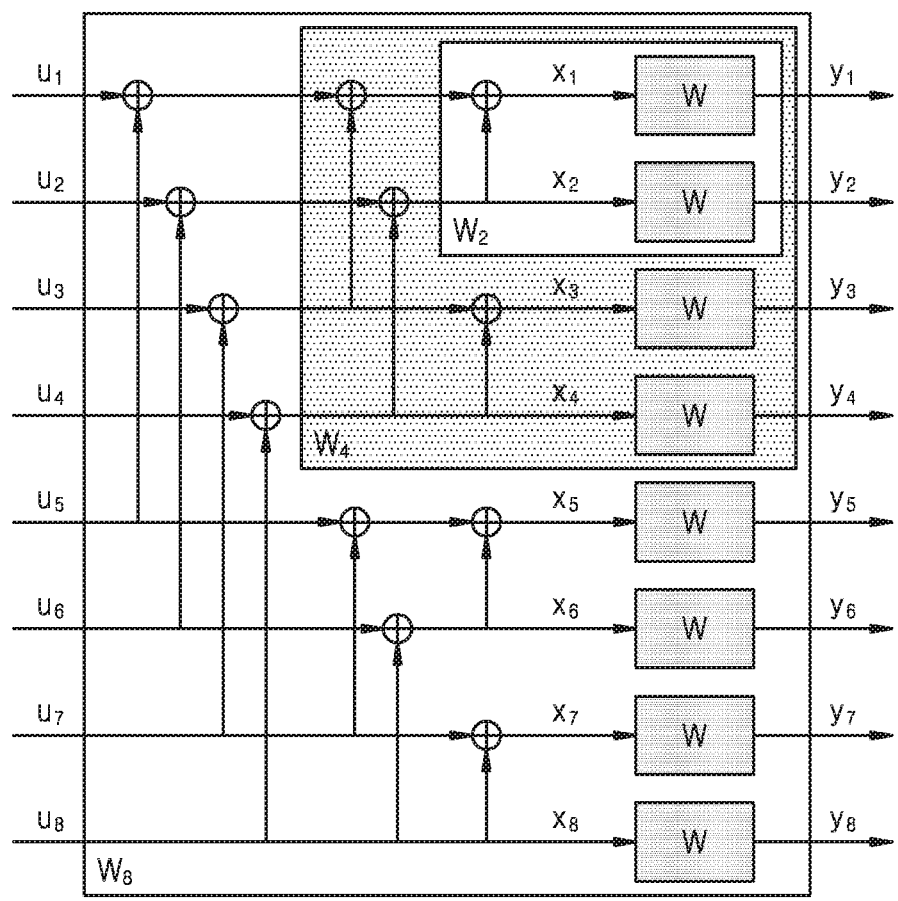
FIG. 4 illustrates an example of an operation of an encoder of FIG. 1 in accordance with an example embodiment of the inventive concepts.

For example, FIG. 4 shows an operation of the encoder 16 according to $G_8$ (i.e., N=8). According to [Equation 1], as N increases, the sub-channels may be polarized, and each of the sub-channels may be referred to as a polarized sub-channel. The sub-channel mapping unit 14 and the encoder 16, which generate the polar encoded code word PCW from the CRC data DCRC, may be collectively referred to as a polar encoder.

The rate matching unit 18 may generate output data DOUT by rate matching the polar encoded code word PCW. The rate matching unit 18 may perform rate matching by puncturing and/or shortening the polar encoded code word PCW in the manner desired by the wireless communication system 100. The output data DOUT rate-matched by the rate matching unit 18 may be converted by sequentially passing through a modulator, a mixer, a power amplifier, an antenna, etc., and may be transferred to the UE 20 through the DL 30.

The UE 20 may receive a signal transmitted from the BS 10 through the DL 30. For example, the received signal may be converted to data by passing through the antenna, a filter, a low noise amplifier, an analog-to-digital converter, etc., and the converted data may be transferred to the polar decoder 22 as a polar encoded code word PCW'. The polar decoder 22 may generate decoded data DEC by decoding the polar encoded code word PCW, and thus extract information (e.g., the input data DIN) sent by the BS 10.

In some example embodiments, the polar decoder 22 may sequentially decode the polar encoded code word PCW on a bit basis based on successive cancellation (SC) decoding. In some example embodiments, the polar decoder 22 may maintain a plurality of candidate decoding paths based on list decoding and decode the polar encoded code word PCW while discarding the decoding paths according to a maximum likelihood. Successive cancellation list (SCL) decoding may be referred to as a combination of SC decoding and list decoding. In some example embodiments, as described below with reference to FIG. 5B, a method such as a simplified successive cancellation (SSC) decoding method may be used to reduce computation complexity by classifying nodes into predetermined (or alternatively, desired) groups in a decoding tree. In some example embodiments, a method including cascading CRC codes and polar codes may be used to improve performance of SCL decoding. It is noted that the above decoding methods are merely illustrative, however, and example embodiments of the inventive concepts are not limited to the decoding methods described above.

According to an example embodiment of the inventive concepts, the polar decoder 22 may be informed of a predefined (or alternatively, desired) value of a PI bit inserted by the sub-channel mapping unit 14 of the BS 10 during a process of decoding the polar encoded code word PCW', and may use a result of decoding the PI bit (e.g., an estimated PI bit). The polar decoder 22 may early terminate a decoding operation in some example embodiments, and may use list pruning of list decoding in some example embodiments, based on the estimated PI bit. Also, the estimated PI bit may reduce a false alarm rate (FAR) by performing a CRC function.

Figure 2:
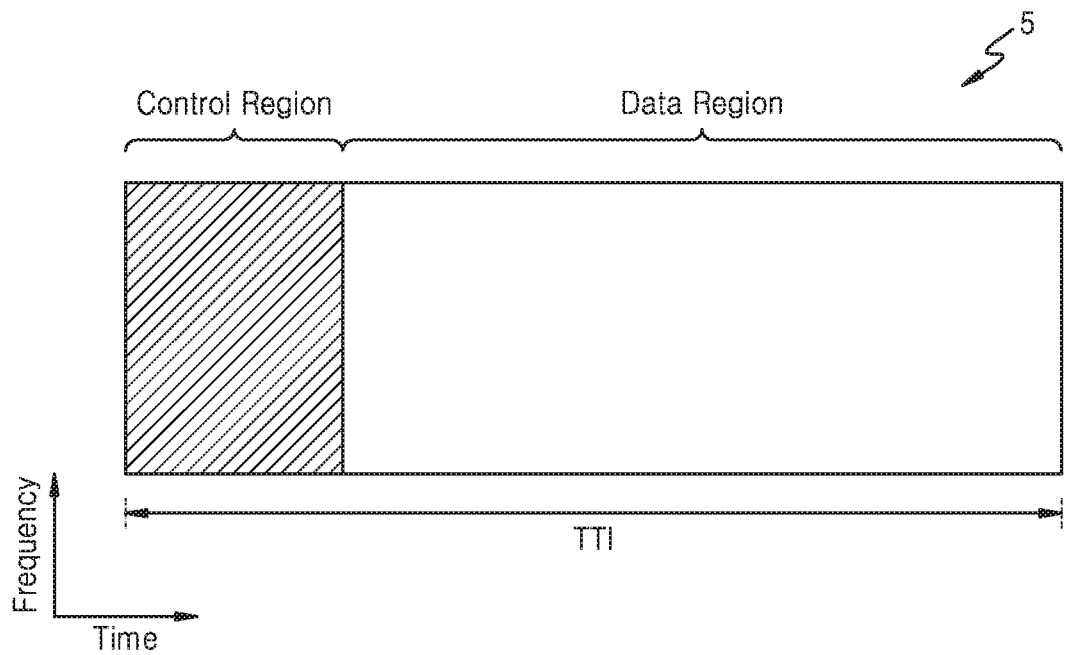
FIG. 2 is a block diagram illustrating an example of a structure of a downlink (DL) of FIG. 1 in accordance with an example embodiment of the inventive concepts.

FIG. 2 is a block diagram illustrating an example of a structure of the DL 30 of FIG. 1 in accordance with an example embodiment of the inventive concepts. For example, FIG. 2 shows a Transmission Time Interval (TTI) of the DL 30 of FIG. 1. In the wireless communication system 100, data of DL 30 may be transmitted in TTI units, and one TTI may be defined as a time interval including a plurality of symbols (e.g., OFDM symbols). For example, a TTI in LTE may be a sub-frame having a length of 1 ms, and a TTI in 5G may be a scalable TTI. Hereinafter, FIG. 2 will be described with reference to FIG. 1.

Referring to FIG. 2, a TTI 5 of the DL 30 may include two time region multiplexed by Time Division Multiplexing (TDM). For example, the two time region may include a control region for transmission of a control channel (e.g., PDCCH or PHICH) and a data region for transmission of a shared channel (e.g., PDSCH). For example, the control region may include a plurality of symbols for the control channel, and the data region may comprise remaining symbols for the shared channel.

The control region may include information about the DL 30. For example, in LTE, downlink control information (DCI) may be transmitted through a PDCCH of the control region. The DCI may include information that the UE 20 needs to communicate with the BS 10, for example, a hopping flag, a resource block allocation, a Modulation Coding Scheme (MCS), and/or a Redundancy Version (RV). The BS 10 may transmit a plurality of physical control channels in the control region for a plurality of user equipments. For example, the PDCCH of LTE may be transmitted on an aggregation of one or more consecutive control channel elements (CCEs). An CCE may be referred to as a logical allocation unit for providing a PDCCH of a predetermined (or alternatively, desired) code rate according to a state of a radio channel, and may correspond to a plurality of resource element groups (REGs). The BS 10 may add a CRC to control information. The CRC may be masked according to an owner or use of the PDCCH. For example, the BS 10 may generate a PDCCH for the UE 20 by masking a unique identifier (e.g., cell-RNTI) of the UE 20 to the CRC.

The UE 20 may monitor a plurality of physical control channels. For example, the wireless communication system 100 may define a limited set of CCE locations in which a physical control channel may be located for the UE 20. The limited set of CCE locations may be a space in which the UE 20 may search for its own physical control channel, and may be referred to as a search space (SS). In order to omit side information for a location of the physical control channel and to reserve resources for a plurality of user equipments, the BS 10 may not provide information about where the physical control channel is located in the control region to the UE 20. Accordingly, the UE 20 may find its own physical control channel by attempting to decode physical control channel candidates in the TTI 5. Through such blind decoding, the UE 20 may identify the physical control channel transmitted thereto. For example, in LTE, the UE 20 may de-mask the PDCCH as the unique identifier (cell-RNTI), and if there is no CRC error, the UE 20 may identify the PDCCH as its own PDCCH. In some example embodiments, the UE 20 may be required to perform blind decoding up to 60 times within one TTI 5.

The UE 20 may have a weighted decoding load due to blind decoding, which may require the UE 20 of high computing performance or reduce overall performance of the UE 20 due to heavy decoding load. For example, if the wireless communication system 100 is 5G, the maximum number of attempts for blind decoding that the UE 20 tries in one TTI 5 may be further increased compared to LTE, and it may be desirable that time taken in each of the attempts is shortened. Accordingly, an early termination of the decoding operation of the physical control channel may be desirable in blind decoding. For example, in the case of 5G, because the polar code is adopted as a channel encoding method, it may be desirable to early terminate the blind decoding using the polar code.

Figure 3:
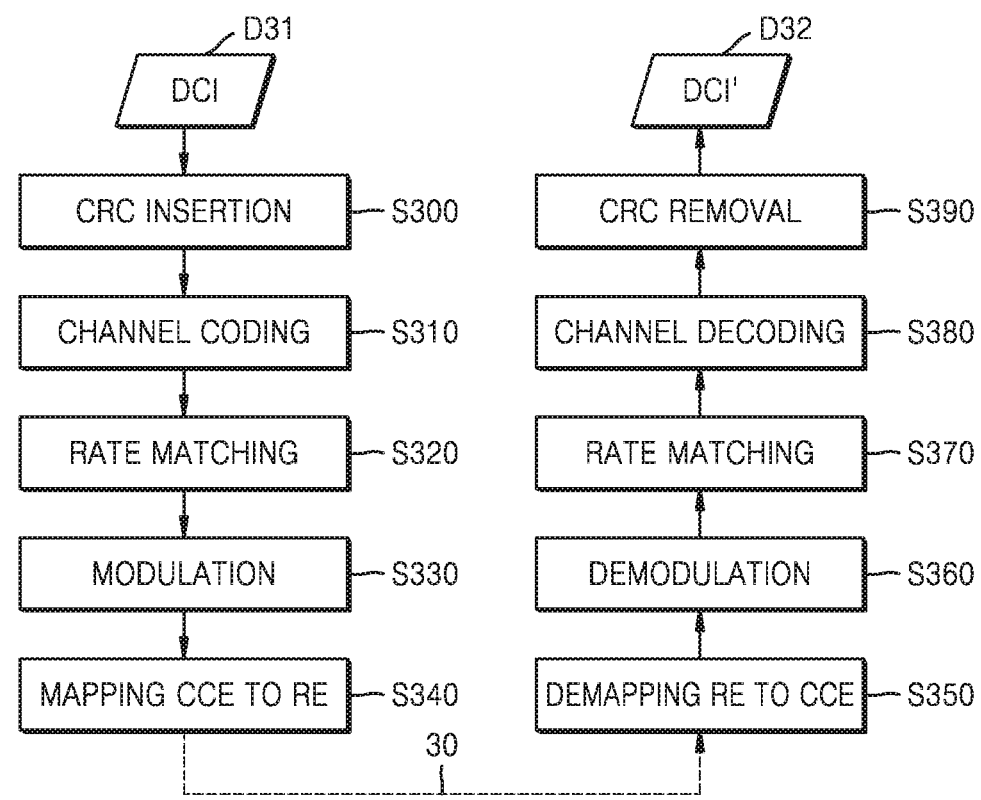
FIG. 3 illustrates an example of a process in which downlink control information (DCI) is transferred from a base station (BS) of FIG. 1 to a user equipment (UE) in accordance with an example embodiment of the inventive concepts.

FIG. 3 illustrates an example of a process in which DCI D31 is transferred from the BS 10 of FIG. 1 to the UE 20 in accordance with an example embodiment of the inventive concepts. For example, FIG. 3 illustrates a process in which the DCI D31 is transferred from the BS 10 to the UE 20 in the case where the wireless communication system 100 is LTE. As shown in FIG. 3, the BS 10 may transmit the DCI D31 to the UE 20 by performing a series of operations S300 to S340, and the UE 20 may perform a series of operations S350 to S390 to generate estimated DCI' D32. Hereinafter, FIG. 3 will be described with reference to FIG. 1.

Referring to FIG. 3, in operation S300, an operation of inserting a CRC into the DCI D31 may be performed. In some example embodiments, the BS 10 may mask a unique identifier (e.g., cell-RNTI) of the UE 20 to the CRC.

In operation S310, channel coding may be performed. For example, channel coding may include encoding using polar codes, and as described above with reference to FIG. 1, unfrozen bits, and frozen bits in which a PI bit is added to the DCI D31, may be encoded. Thus, a polar encoded code word may be generated. Examples of operation S310 will be described with reference to FIGS. 6 to 10.

In operation S320, rate matching may be performed. For example, the BS 10 may perform rate matching by performing puncturing and/or shortening. Then, in operation S330, an operation of modulating a rate-matched code word may be performed. In operation S340, an operation of mapping a CCE to a physical resource element (RE) may be performed. Accordingly, a signal including information of the DCI D31 may be transmitted to the UE 20.

In operation S350, an operation of demapping the physical RE to the CCE may be performed. In operation S360, an operation of demodulating the CCE may be performed. As described above, the UE 20 may demodulate an aggregation of each CCE because the UE 20 may not be informed which aggregation of CCE is used to receive a PDCCH. Then, in operation S370, rate matching may be performed on demodulated data. Similarly, the UE 20 may perform rate matching on each DCI format because the UE 20 may not be informed which DCI payload size is used to receive control information.

In operation S380, channel decoding may be performed. For example, the polar decoder 22 included in the UE 20 may perform decoding on the rate-matched data based on, for example, SCL decoding, and detect whether an error occurs through the CRC. In some example embodiments, during the decoding process, decoding on the rate-matched data may be early terminated according to a decoding result of the PI bit, and decoding on other rate-matched data may be continued or initiated. Examples of operation S380 will be described below with reference to FIGS. 11 through 14.

In operation S390, an operation of removing the CRC may be performed. For example, the UE 20 may detect its PDCCH in operation S380 and obtain an estimated DCI' D32 by removing the CRC from the decoded data.

FIG. 4 illustrates an example of an operation of the encoder 16 of FIG. 1 in accordance with an example embodiment of the inventive concepts. As described above with reference to FIG. 1, the encoder 16 may perform channel coding based on polar codes. For example, FIG. 4 shows an example of generating polar encoded code word of 8 bits $\{x_1, \ldots, x_8\}$ from bit sequence of 8 bits $\{u_1, \ldots, u_8\}$ in a transmitter (e.g. the BS 10 of FIG. 1) and receiving data of 8 bits $\{y_1, \ldots, y_8\}$ in a receiver (e.g. the UE 20 of FIG. 1) through a channel $W_N$.

A channel $W_N: X^N \to Y^N$ in which N independent channels W are combined by using a bit sequence of N bits as an input may be recursively combined from $W_{N/2}$. For example, FIG. 4 shows a combined channel $W_8$ and sub-channels $W_4$ and $W_2$. A combined channel $W_N$ may be divided into N binary input coordinate channels $W_N^{(i)}: X \to Y^N \times X^{i-1}$, $1 \le i \le N$, and a transition probability in each channel may be defined as shown in [Equation 2] below.

$$W_N^{(i)}(y_1^N, u_1^{i-1} \mid u_i) = \sum_{u_{i+1}^N \in X^{N-i}} \frac{1}{2^{N-1}} W_N(y_1^N \mid u_1^N) \quad \text{[Equation 2]}$$

The transition probability of [Equation 2] may be recursively expressed as shown in [Equation 3] below.

$$(W_N^{(i)}, W_N^{(i)}) \to (W_{2N}^{(2i-1)}, W_{2N}^{(2i)}) \quad \text{[Equation 3]}$$

-continued $$W_{2N}^{(2i-1)}(y_1^{2N}, u_1^{2i-2} \mid u_{2i-1}) = \sum_{u_{2i}} \frac{1}{2} W_N^{(i)}(y_{1,o}^{2N},$$

$$u_{1,o}^{2i-2} \oplus u_{1,e}^{2i-2} \mid u_{2i-1} \oplus u_{2i}) W_N^{(i)}(y_{1,e}^{2N}, u_{1,e}^{2i-2} \mid u_{2i})$$

$$W_{2N}^{(2i)}(y_1^{2N}, u_1^{2i-1} \mid u_{2i}) = \frac{1}{2} W_N^{(i)}(y_{1,o}^{2N},$$

$$u_{1,o}^{2i-2} \oplus u_{1,e}^{2i-2} \mid u_{2i-1} \oplus u_{2i}) W_N^{(i)}(y_{1,e}^{2N}, u_{1,e}^{2i-2} \mid u_{2i})$$

In a Binary Erasure Channel (BEC), transition probabilities according to [Equation 3] may be simply calculated. For example, when an erasure probability ε is 0.5, a transition probability of each of channels $W_8^{(1)}, \ldots, W_8^{(8)}$ shown in FIG. 4 may be calculated as shown in [Equation 4] below.

$$(W_8^{(1)}, W_8^{(8)}) = (0.996094, 0.683594, 0.808594,$$
$$0.121094, 0.878906, 0.191406, 0.316406,$$
$$0.003906) \qquad \text{[Equation 4]}$$

[Equation 4] shows that the transition probabilities corresponding to the channels $W_8^{(1)}, W_8^{(2)}, W_8^{(3)}, W_8^{(5)}$ are relatively close to 1, whereas the transition probabilities corresponding to the channels $W_8^{(4)}, W_8^{(6)}, W_8^{(7)}, W_8^{(8)}$ are relatively close to 0. In the case where N increases, each of the transition probabilities may converge to 1 or 0, and this phenomenon may be referred to as channel polarization. A unfrozen bit having a variable value may be assigned to a good channel, that is, a bit channel having a low transition probability, while a frozen bit having a fixed value to a bad channel, that is, a bit channel having a high transition probability. For example, in the example of FIG. 4, four bits $\{u_4, u_6, u_7, u_8\}$ may be unfrozen bits while the remaining four bits $\{u_1, u_2, u_3, u_5\}$ may be frozen bits.

As described above, at least one of the unfrozen bits $\{u_4, u_6, u_7, u_8\}$ may be used as a PI bit known to both an encoder and a decoder. That is, the unfrozen bits $\{u_4, u_6, u_7, u_8\}$ may include information bits and the at least one PI bit, and the information bits may include an input bit and a CRC bit. As such, the PI bit having a predefined (or alternatively, desired) value may be assigned to unfrozen bits other than frozen bits, and thus desirable characteristics may be obtained and consequently efficiency of the wireless communication system (e.g., 100 of FIG. 1) may be improved.

Figure 5A:
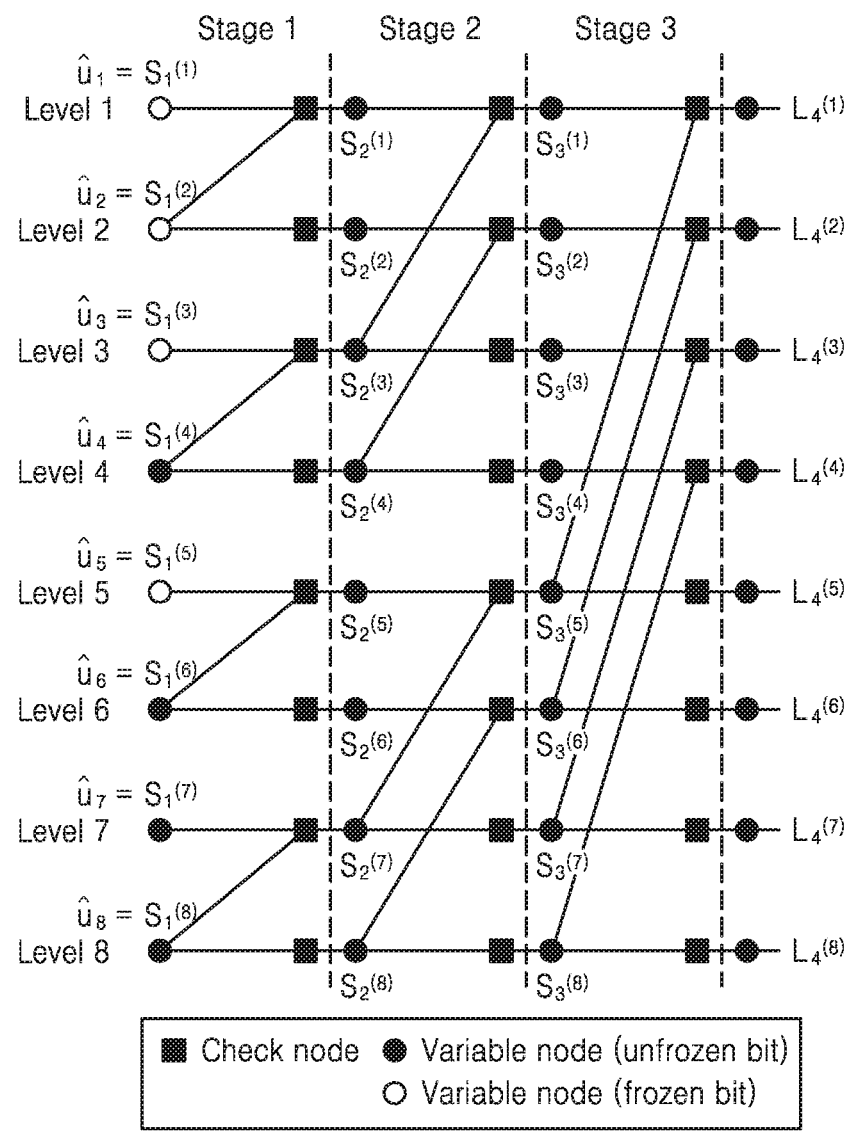
FIGS. 5A and 5B illustrate examples of an operation of a polar decoder of FIG. 1 in accordance with an example embodiment of the inventive concepts.
Figure 5B:
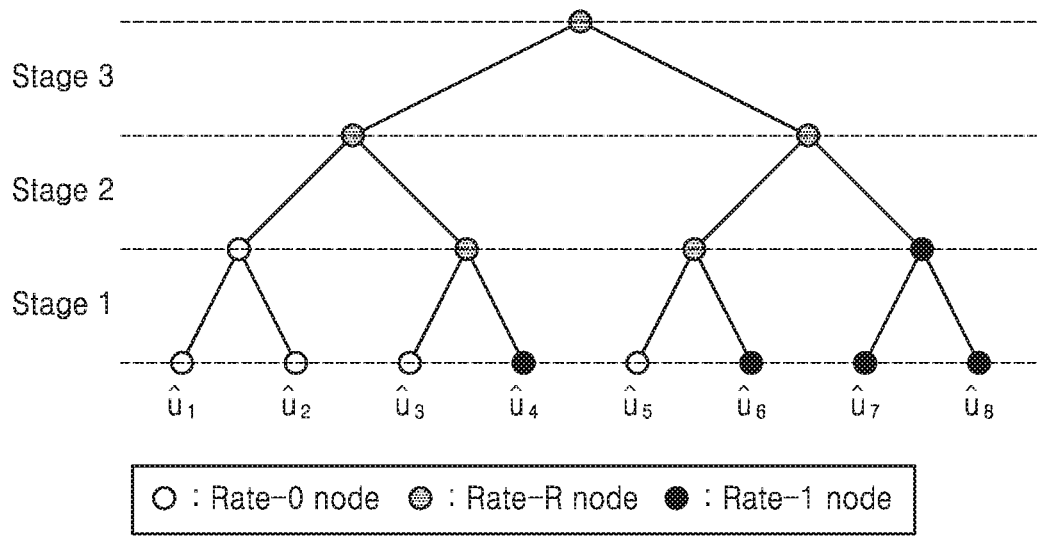

FIGS. 5A and 5B illustrate examples of an operation of the polar decoder 22 of FIG. 1 in accordance with an example embodiment of the inventive concepts. For example, FIG. 5A shows a trellis of a polar code with N=8, and FIG. 5B shows a binary tree structure of the polar codes with N=8. For example, FIGS. 5A and 5B may correspond to an encoder structure of FIG. 4. As shown in FIGS. 5A and 5B, on the whole, a sub-channel having a low index may have relatively low reliability, and a sub-channel having a high index may have relatively high reliability.

Referring to FIG. 5A, estimated bits corresponding to variable nodes are represented by $s_j^{(i)}$ where i and j represent a level and a stage of the trellis, respectively ($1 \leq i \leq n+1$, $1 \leq j \leq N$). $L_j^{(i)}$ that is a log likelihood ratio (LLR) of $s_j^{(i)}$ may be calculated as shown in [Equation 5] below.

$$L_j^{(i)} = \begin{cases} 2\tanh^{-1}\left[\tanh\left(\frac{L_{j+1}^{(i)}}{2}\right) \cdot \\ \tanh\left(\frac{L_{j+1}^{(i+2^{j-1})}}{2}\right)\right] & \text{if } \left\lfloor \frac{i-1}{2^{j-1}} \right\rfloor \bmod 2 = 0 \\ \left(1 - 2s_j^{(i-2^{j-1})}\right)\left(L_{j+1}^{(i-2^{j-1})}\right) + \\ L_{j+1}^{(i)} & \text{otherwise} \end{cases} \qquad \text{[Equation 5]}$$

Based on [Equation 5], a bit sequence $\{\hat{u}_1, \ldots, \hat{u}_N\}$ estimated in SS decoding may be expressed as [Equation 6] below.

$$\hat{u}_i = \begin{cases} u_i & \text{for } i = \text{index of frozen bit} \\ s_1^{(i)} & \text{for } i = \text{index of unfrozen bit} \end{cases} \qquad \text{[Equation 6]}$$

In [Equation 6], $s_1^{(i)}$ may be expressed as [Equation 7] below.

$$s_1^{(i)} = \begin{cases} 0 & \text{if } L_1^{(i)} \geq 1 \\ 1 & \text{otherwise} \end{cases} \qquad \text{[Equation 7]}$$

Referring to FIG. 5B, SC decoding may be represented by a binary tree having a depth n in the case where $2^n = N$. For example, as shown in FIG. 5B, the trellis of FIG. 5A may be represented by a binary tree having leaf nodes with depth 3 and $2^3 = 8$. In the binary tree, each node may be classified according to its characteristic. For example, as shown in FIG. 5B, the nodes in the binary tree may be classified as Rate-0 nodes having only frozen bits as child nodes, Rate-1 nodes having only unfrozen bits as child nodes, and Rate-R nodes having both frozen bits and unfrozen bits as child nodes. A sub-tree including nodes classified in the same manner may be replaced by a single node of the same classification, and thus the binary tree may be simplified. For example, in FIG. 5B, the nodes corresponding to estimated bits $\{\hat{u}_1, \hat{u}_2\}$ and their parent nodes may be replaced by one Rate-0 node and estimated bits $\{\hat{u}_7, \hat{u}_8\}$ and their parent nodes may be replaced by one Rate-1 node. SC decoding may be simplified due to the simplified binary tree.

Figure 6:
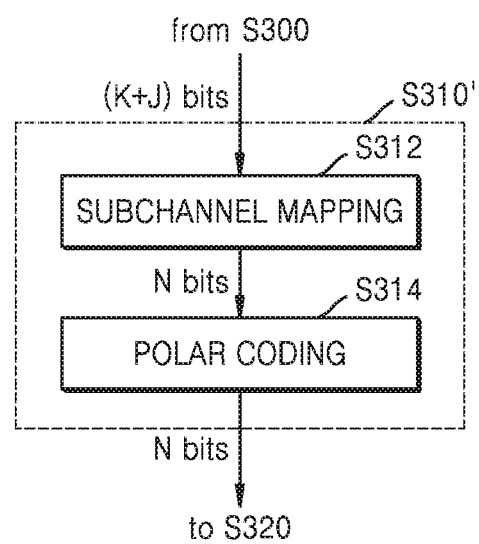
FIG. 6 is a flowchart illustrating an example of operation S310 of FIG. 3 in accordance with an example embodiment of the inventive concepts.

FIG. 6 is a flowchart illustrating an example of operation S310 of FIG. 3 in accordance with an example embodiment of the inventive concepts. As described above with reference to FIG. 3, in operation S310' of FIG. 6, channel encoding may be performed based on polar codes. As shown in FIG. 6, operation S310' may include operations S312 and S314, and may include encoding data of (K+J) bits (e.g., DCRC in FIG. 1) received from operation S300 of FIG. 3 to generate code words of N bits (e.g., PCW in FIG. 1) and provide the code words of N bits to operation S320 of FIG. 3. For example, operation S310' of FIG. 6 may be performed by the sub-channel mapping unit 14 and the encoder 16 of FIG. 1. Hereinafter, FIG. 6 will be described with reference to FIG. 1.

Referring to FIG. 6, in operation S312, sub-channel mapping may be performed. For example, the sub-channel mapping unit 14 may generate unfrozen bits of (K+J+J') bits by adding PI bits of J' bits having a predefined (or alternatively, desired) value to data of (K+J) bits based on the input data DIN (or derived from the input data DIN) and generate a bit sequence of N bits by reordering the unfrozen bits and frozen bits of N−(K+J+J') bits. As described above, in the bit sequence, the unfrozen bits may be assigned to sub-channels (or bit channels) having relatively high reliability, while the frozen bits may be assigned to sub-channels having a relatively low reliability. Thus, the PI bit may be utilized in various ways, such as early termination and/or list pruning, at a later decoding operation (e.g., S380 in FIG. 3) due to the sub-channels having the relatively high reliability.

In operation S314, polar coding may be performed. For example, the encoder 16 may generate polar encoded code word of N bits by processing the N-bit bit sequence from the sub-channel mapping unit 14.

Figure 7:
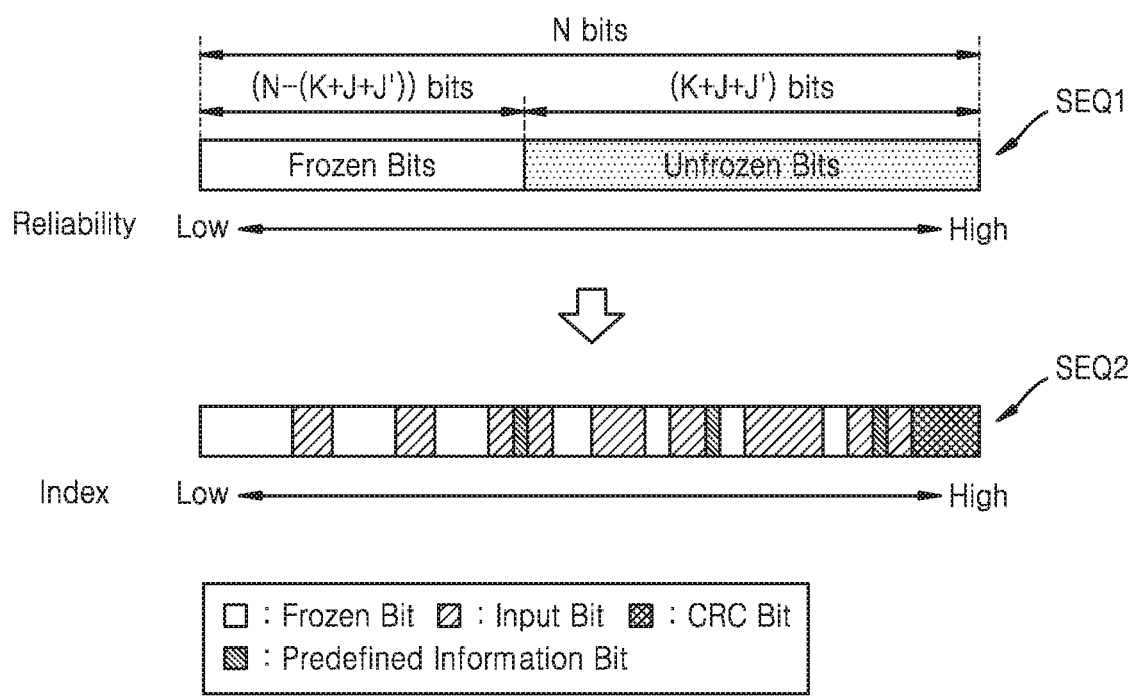
FIG. 7 illustrates an example of an operation of operation S312 of FIG. 6 in accordance with an example embodiment of the inventive concepts.

FIG. 7 illustrates an example of an operation of operation S312 of FIG. 6 in accordance with an example embodiment of the inventive concepts. As described above with reference to FIG. 6, in operation S312, an operation of mapping a sub-channel may be performed. For example, the example of FIG. 7 may be performed by the sub-channel mapping unit 14 of FIG. 1. FIG. 7 will be described below with reference to FIGS. 1 and 6.

Referring to FIG. 7, unfrozen bits of (K+J+J') bits may be generated by adding PI bits of J' bits to PI bits of (K+J) bits. Accordingly, a first bit sequence SEQ1 of N bits may be generated by inserting frozen bits of N−(K+J+J') bits. The first bit sequence SEQ1 may be aligned according to sub-channel reliability, and as shown in FIG. 7, the unfrozen bits may correspond to sub-channels having a higher reliability than that of the frozen bits.

The first bit sequence SEQ1 may be reordered as a second bit sequence SEQ2. That is, the first bit sequence SEQ1 may be reordered based on an index of polarized sub-channels of a polar code. For example, as shown in FIG. 7, in the second bit sequence SEQ2, most of the frozen bits may correspond to lower indices, and some of the frozen bits may correspond to higher indices, and as described with reference to FIGS. 4, 5A and 5B, good bit channels and bad bit channels may be interleaved in the second bit sequence SEQ2. Thus, as shown in FIG. 7, the frozen bits and the unfrozen bits may be reordered in the second bit sequence SEQ2, and the second bit sequence SEQ2 may be provided to an encoder (e.g., 16 in FIG. 1).

In some example embodiments, CRC bits of J bits may have a high index in the second bit sequence SEQ2, as shown in FIG. 7. In some example embodiments, the index of the second bit sequence SEQ2 may be assigned such that the PI bits of J' bits included in the unfrozen bits are assigned to a sub-channel having relatively high-reliability. Also, in some example embodiments, the index of the second bit sequence SEQ2 may be assigned based on rate matching performed subsequent to encoding. Examples of assigning the index of the second bit sequence SEQ2 to PI bits will be described below with reference to FIGS. 8 and 9.

In some example embodiments, the CRC bits of J bits may be interleaved with input bits, and thus the CRC bits of J bits may be distributed in the second bit sequence SEQ2 differently as shown in FIG. 7. The distributed CRC bits may be considered in the polar code as assistance bits. The PI bits may be distributed in the second bit sequence SEQ2 as shown in FIG. 7 or may be assigned to sub-channels corresponding to high reliability as will be described with reference to FIG. 8, and thus the distributed PI bits may perform the same or similar function as the distributed CRC bits. That is, the same effect as the distributed CRC bits occurs due to the distributed PI bits. Also, the PI bits may function to reduce a false alarm rate (FAR). For example, the FAR according to the CRC bits of 16 bits may be approximately 2-16. At this time, in the case where the number of lists in list decoding is 8, the FAR may be increased to 2-16+3. In the case where a required FAR is 2-16, the CRC bits may be increased to 19 bits to meet this requirement. However, instead of increasing the number of bits of the CRC bits, in the case where the PI bits of 3 bits are added, the above-mentioned functions due to the PI bits may be obtained and simultaneously the FAR may be maintained as 2-16. That is, the FAR may be determined based on the number of bits of the CRC bits and the number of bits of the PI bits.

Figure 8:
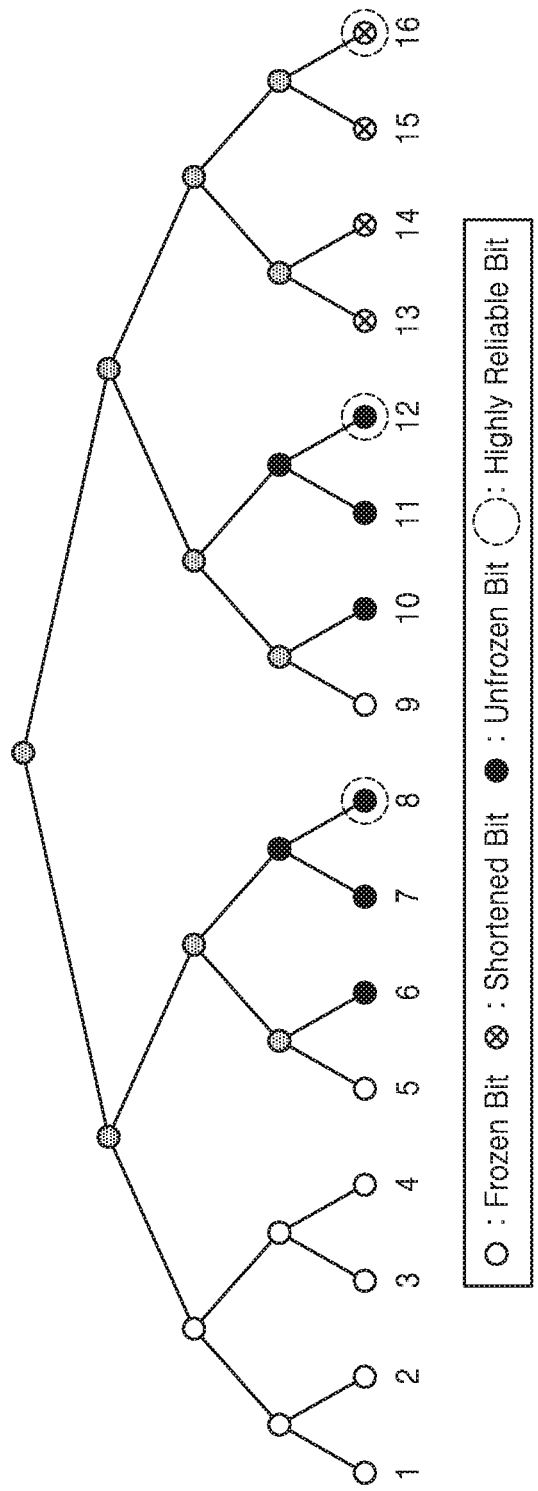
FIG. 8 illustrates an example of a binary tree of a polar code in accordance with an example embodiment of the inventive concepts.

FIG. 8 illustrates an example of a binary tree of a polar code in accordance with an example embodiment of the inventive concepts. For example, the binary tree of FIG. 8 may have 16 leaf nodes, among the leaf nodes, black filled nodes represent unfrozen bits, white filled nodes represent frozen bits, and X filled nodes represent shortened bits. Also, in the example of FIG. 8, unfrozen bits of 6 bits may include input bits of 3 bits, CRC bits of 2 bits, and PI bits of 1 bit (i.e., K=3, J=2, J'=1). In the example of FIG. 8, a mother block size N may be 16, and a block size M may be 12.

In some example embodiments, the PI bits may be indexed such that the PI bits are substantially uniformly distributed in the unfrozen bits. For example, the PI bits may be distributed based on weights of a generator matrix. Also, in some example embodiments, the PI bits may be uniformly distributed and simultaneously assigned to sub-channels of relatively high reliability. For example, a sub-tree as a part of the binary tree of the polar code may have leaf nodes corresponding to a power of 2, and the rightmost leaf node of FIG. 8 having a highest index among the leaf nodes may correspond to a sub-channel having high reliability. As shown in FIG. 8, in the sub-tree including the leaf nodes of indices 5 through 8, the leaf node of index 8 may correspond to the sub-channel having the high reliability. Similarly, as shown in FIG. 8, the leaf node of the highest index in the sub-trees including 4 leaf nodes may correspond to the sub-channel having the high reliability. Thus, the highest index (e.g., 8, 12, or 16 in FIG. 8) in the sub-tree having the unfrozen bits as the leaf nodes may be assigned to the PI bits. In other words, as described above with reference to FIG. 5B, because the Rate-1 node and the Rate-R node include the unfrozen bits as the leaf nodes, the PI bits may be assigned to a sub-channel having the highest reliability among leaf nodes of the Rate-1 node or the Rate-R node.

In some example embodiments, the PI bits may be assigned in consideration of rate matching. For example, as shown in FIG. 8, in the case where rate matching performed subsequent to encoding is shortening that deletes an end of a sequence, the PI bits may not be assigned to a shortening region. That is, in the example of FIG. 8, 16 may be excluded from 8, 12, and 16 that are candidate indices of the PI bits.

In some example embodiments, the PI bits may be assigned to have a low index among candidate indices in a bit sequence. As described above, the PI bits may be used for early termination of decoding in a decoder of a receiver, and in the case of a decoding method such as SC decoding, in the case where the PI bits are placed ahead (e.g., in case of the PI bits have the low index) early termination of decoding may be determined at an early time. Thus, in the example of FIG. 8, the PI bits of 1 bit may have 8 among the candidate indices 8, 12 and 16. Also, in the case of more than the PI bits of 2 bits or more, the PI bits may sequentially have the candidate indices in an ascending order.

Figures 9, 10:
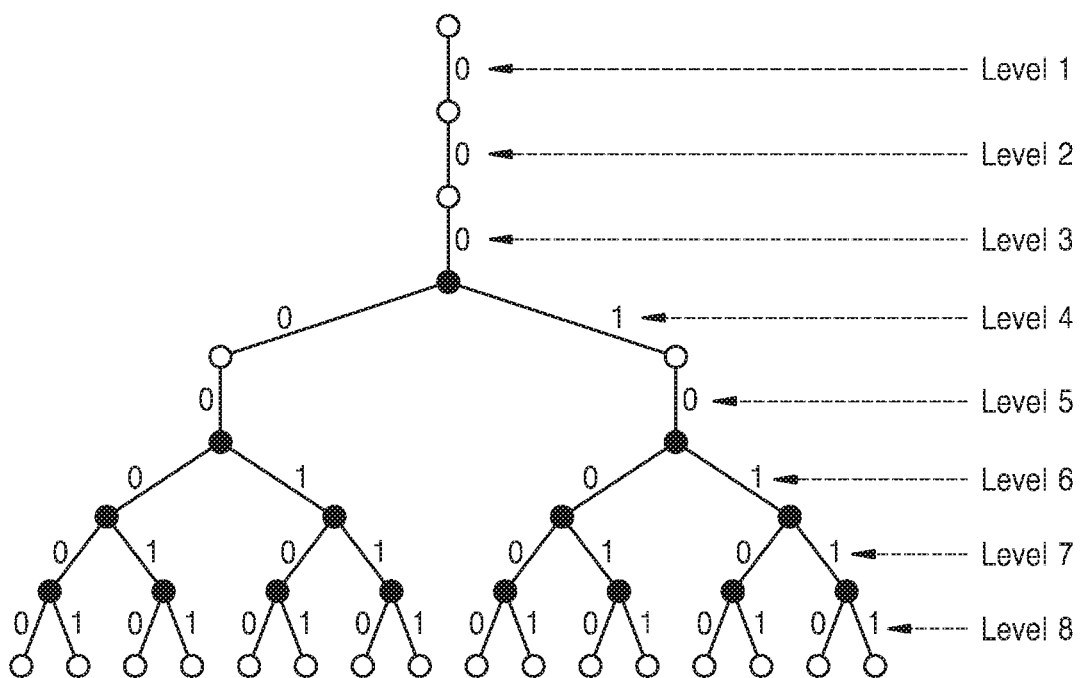
FIG. 9 is a pseudo code illustrating an example of a method of assigning predefined information (PI) bits in accordance with an example embodiment of the inventive concepts.
FIG. 10 illustrates a code tree of bits of a bit sequence according to levels in SC decoding in accordance with an example embodiment of the inventive concepts.

FIG. 9 is a pseudo code illustrating an example of a method of assigning PI bits in accordance with an example embodiment of the inventive concepts. In FIG. 9, $u_i$ may represent an i-th information bit, and $e_i$ may represent an i-th PI bit. Also, $I(u_i)$ may represent an index in a bit sequence, for example, $I(u_1)$ in FIG. 8 may be 6. Hereinafter, FIG. 9 will be described with reference to FIG. 8.

In a case where L denotes the number of decoding lists, an index in a bit sequence of the i-th PI bit $e_i$ may be greater than $I(u_{log_2 L})$. That is, early termination may be started after list diverging ends. For example, in a case where L is 4, $I(u_{log_2 L})=I(u_2)=7$, and thus $I(e_1)$ may be 8. At a high code rate, because multiple input bits may be placed in a front area of a mother block, a placement of the PI bits may be needed to increase efficiency of early termination, as described below.

In some example embodiments, in a case where a set of PI bits of J' bits is E, the set E may be obtained as shown in FIG. 9. Referring to FIG. 9, at line 11 and line 12, initialization of variables may be performed. At line 13, a position of an input bit may be checked. In a case where an index of the input bit is greater than N/4, at line 14 and line 15, the PI bit $e_i$ may be assigned spaced by $2^{n-i}$ from a preceding PI bit $e_{i-1}$. On the other hand, in a case where the index of the input bit is not greater than N/4, at line 17 and line 18, the PI bit $e_i$ may be assigned spaced by $2^{\lceil log_2 I(e_1) \rceil - k}$ from the preceding PI bit $e_{i-1}$, and k may be increased based on an index $I(u_K)$ of an input bit $u_K$ at $2^{\lceil log_2 I(e_1) \rceil - k}$. For example, let us assume that a size of the mother block is determined as N=512, n=9, and L=8. In a case where $I(u_4)$ is greater than 128, the PI bits may be assigned with indices 256 ($=2^8$), 384 ($=2^8+2^7$) and 448 ($=2^8+2^7+2^6$). In some example embodiments, the index of the PI bits may be further optimized, and for example in a case where parameters of the polar code are determined, indices of the PI bits may be easily derived from the parameters of the polar code.

FIG. 10 illustrates a code tree of bits of a bit sequence according to levels in SC decoding in accordance with an example embodiment of the inventive concepts. For example, FIG. 10 shows an example of a code tree with N=8.

SC decoding may be represented as a process of determining one path in the code tree of the bits of the estimated bit sequence in a vertical direction according to levels, as shown in FIG. 10. The bits of the estimated bit sequence may be determined sequentially from a high level to a low level in the code tree according to indices. For example, as described above with reference to FIG. 5B, the bits may be sequentially determined according to the indices in the estimated bit sequence $\{\hat{u}_1, \ldots, \hat{u}_8\}$, and a decoding path in bits $\hat{u}_1, \hat{u}_2, \hat{u}_3, \hat{u}_5$ corresponding to frozen bits having zero may proceed to a next bit (i.e. a next level) without being branched as shown in FIG. 10.

Nodes of the code tree may each have LLR values. A candidate decoding path may be added or discarded in each of the levels according to the LLR values in list decoding using a plurality of candidate decoding paths. An operation of discarding the decoding path and no longer performing decoding through the decoding path may be referred to as list pruning. An occurrence of list pruning may shorten a decoding time. As will be described later, PI bits estimated in the decoding process may be utilized not only for early termination of decoding but also for list decoding, thereby improving decoding performance due to the shortened decoding time.

Figure 11:
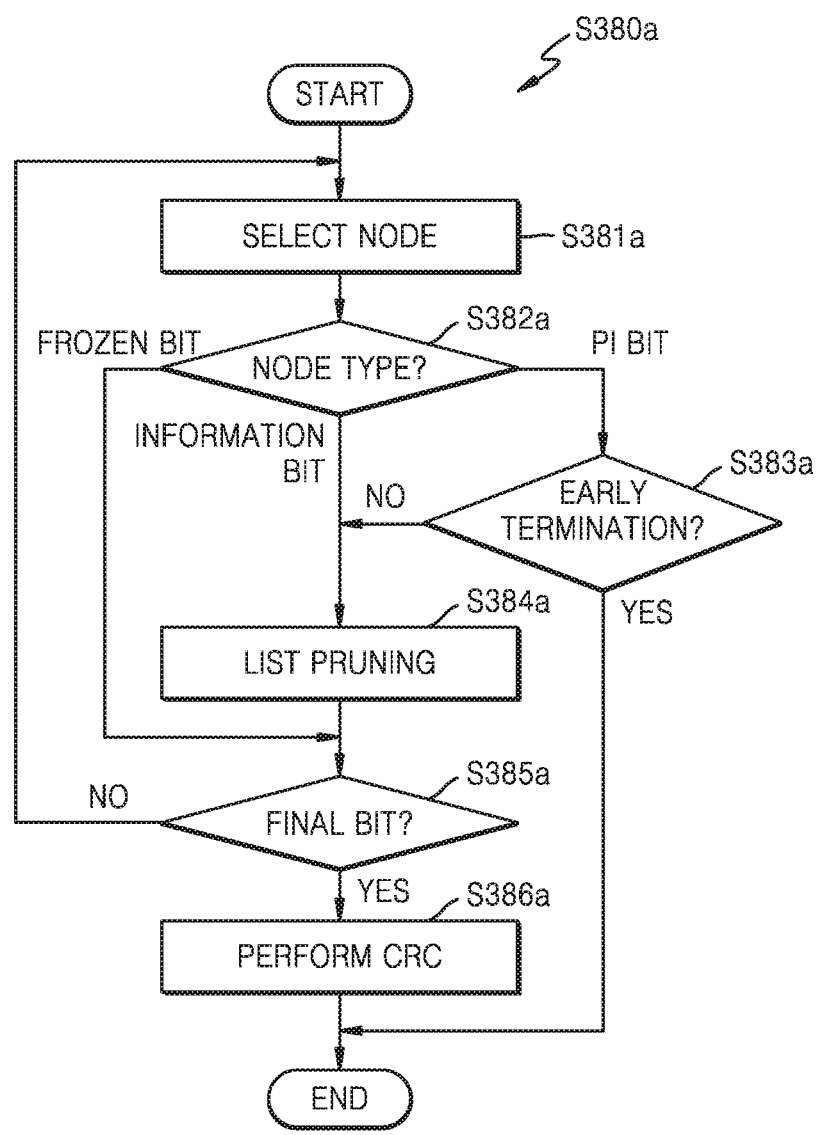
FIG. 11 is a flowchart illustrating an example of operation S380 of FIG. 3 in accordance with an example embodiment of the inventive concepts.

FIG. 11 is a flowchart illustrating an example of operation S380 of FIG. 3 in accordance with an example embodiment of the inventive concepts. As described above with reference to FIG. 3, in operation S380a of FIG. 11, channel decoding based on polar codes may be performed. As shown in FIG. 11, operation S380a may include a plurality of operations S381a through S386a, and may be performed, for example, by the polar decoder 22 of FIG. 1. Hereinafter, operation S380a of FIG. 11 will be described with reference to an example code tree of FIG. 10.

In operation S381a, an operation of selecting a node may be performed. For example, in a case where successive cancellation list (SCL) decoding is performed, a node following a previously processed node in a candidate decoding path may be selected, a node of another candidate decoding path may be selected, and a node of a newly added candidate decoding path may be selected.

In operation S382a, an operation of determining a node type may be performed. As described above with reference to FIG. 7, a node may correspond to a frozen bit or an unfrozen bit. The unfrozen bit may include an information bit and a PI bit, and thus the node may correspond to one of the frozen bit, the information bit and the PI bit. As shown in FIG. 11, operation S385a may be performed subsequently in a case where the node corresponds to the frozen bit, operation S384a may be performed subsequently in a case where the node corresponds to the information bit, and operation S383a may be performed subsequently in a case where the node corresponds to the PI bit.

In operation S383a, an operation of determining early termination may be performed. That is, in operation S382a, in a case where the node type corresponds to the PI bit, early termination may be determined according to a decoding result of the PI bit. In some example embodiments, early termination may be determined according to a decoding result corresponding to the PI bit of a single bit. In some example embodiments, early termination may be determined according to a decoding result corresponding to the PI bit of multi bits. In a case where early termination is determined, operation S380a may be terminated, whereas in a case where early termination is not determined, operation S384a may be performed subsequently. An example of operation S383a will be described later with reference to FIG. 12.

List pruning may be performed in operation S384a. For example, operation S384a may be skipped due to a known value (e.g., zero) in the node corresponding to the frozen bit. In a case where the node type is the unfrozen bit and early termination is not determined, list pruning (S384a) may be performed. As described above with reference to FIG. 10, list pruning may be performed based on an LLR value at each node.

In operation S385a, an operation of determining whether the node corresponds to a final bit may be performed. In a case where the node does not correspond to the final bit, in operation S381a, an operation of selecting another node may be iterated, while in a case where the node corresponds to the final bit, in operation S386a, a CRC may be performed. An occurrence of an error may be detected according to a CRC result.

Figure 12:
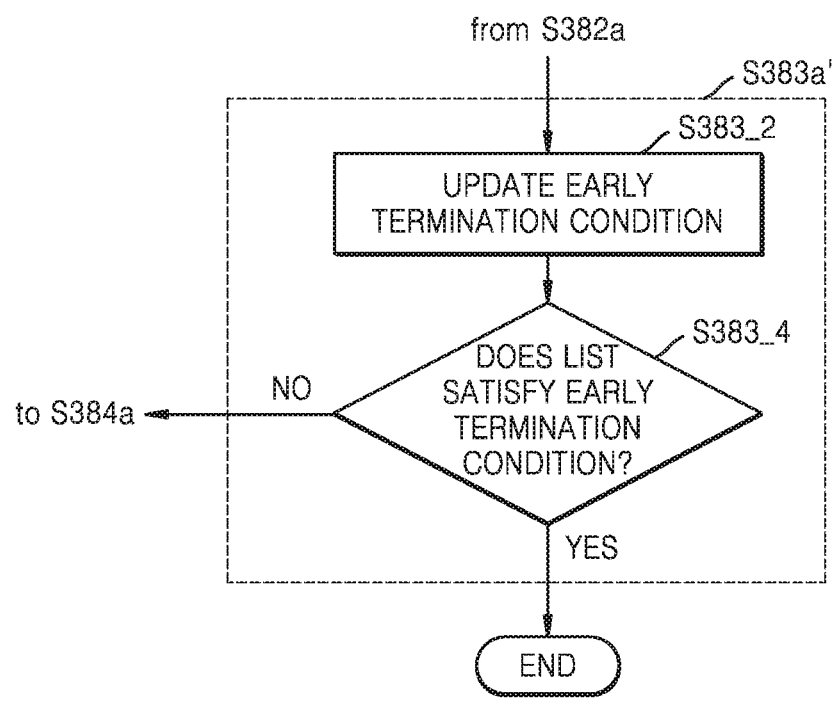
FIG. 12 is a flowchart showing an example of operation S383a of FIG. 11 in accordance with an example embodiment of the inventive concepts.

FIG. 12 is a flowchart showing an example of operation S383a of FIG. 11 in accordance with an example embodiment of the inventive concepts. As described above with reference to FIG. 11, in operation S383a' of FIG. 11, an operation of determining early termination may be performed. As shown in FIG. 12, operation S383a' may include operations S383_2 and operation S383_4, and hereinafter, FIG. 12 will be described with reference to FIG. 11.

In operation S383_2, an operation of updating an early termination condition may be performed. As shown in FIG. 12, in operation S382a of FIG. 11, because a node is determined to correspond to a PI bit, the early termination condition may be updated according to a decoding result of the PI bit (e.g., a value of an estimated PI bit). In some example embodiments, the early termination condition may be updated for each of decoding paths.

In operation S383_4, an operation of determining whether a list satisfies the early termination condition may be performed. That is, in a case where all of the decoding paths included in the list satisfy the early termination condition, operation S380a of FIG. 11 may end, whereas in a case where at least one of the decoding paths included in the list does not satisfy the early termination condition, in operation S384a of FIG. 11, list pruning may be performed. That is, in a process of performing decoding in a state in which candidate decoding paths are maintained according to list decoding, early termination may be determined in a case where all the candidate decoding paths satisfy the early termination condition.

Figure 13:
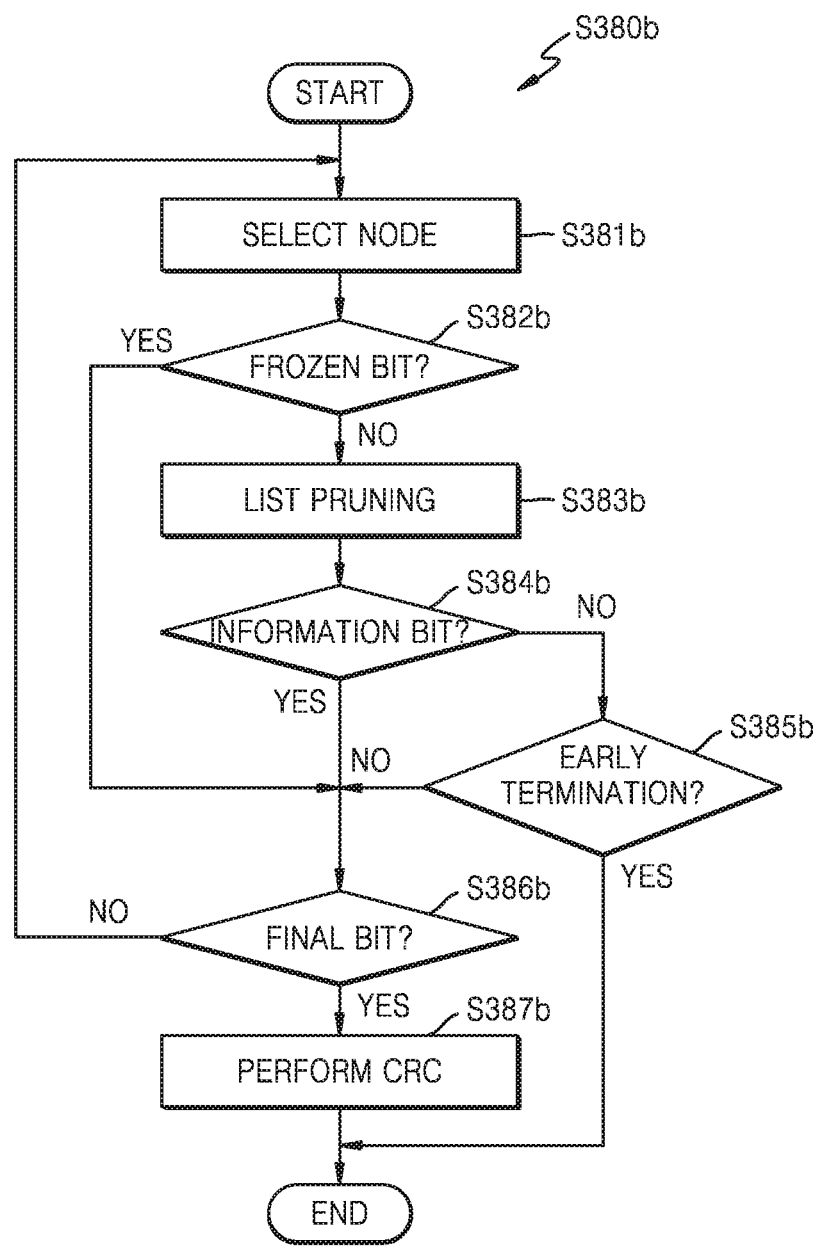
FIG. 13 is a flowchart illustrating an example of operation S380 of FIG. 3 in accordance with an example embodiment of the inventive concepts.

FIG. 13 is a flowchart illustrating an example of operation S380 of FIG. 3 in accordance with an example embodiment of the inventive concepts. As described above with reference to FIG. 3, in operation S380b of FIG. 13, channel decoding based on polar codes may be performed. For example, as compared to operation S380a of FIG. 11, whether a node corresponds to a frozen bit may be first determined, and then before early termination is determined. In a case where the node corresponds to the frozen bit, list pruning may be first performed. As shown in FIG. 13, operation S380b may include a plurality of operations S381b through S387b, and may be performed, for example, by the polar decoder 22 of FIG. Hereinafter, a redundant description of FIG. 13 and FIG. 11 will be omitted.

In operation S381b, an operation of selecting a node may be performed. Then, in operation S382b, an operation of determining whether the node corresponds to the frozen bit may be performed. As shown in FIG. 13, in a case where the node is the frozen bit, operation S386b may be performed subsequently, whereas in a case where the node is not the frozen bit (e.g., in a case where the node is an unfrozen bit) in operation S383b, list pruning may be performed.

After list pruning is performed, in operation S384b, an operation of determining whether the node corresponds to an information bit may be performed. In a case where the node does not correspond to the information bit, that is, in a case where the node corresponds to a PI bit, operation S385b may be performed subsequently, while operation S386b may be performed subsequently in a case where the node corresponds to the information bit.

In operation S385b, an operation of determining whether early termination may be performed. For example, as described above with reference to FIG. 12, it may be determined whether all of candidate decoding paths satisfy an early termination condition, that is, a decoding result of the PI bit is different from a known value. In a case where the early termination condition is satisfied, operation S380b may end, whereas in a case where the early termination condition is not satisfied, operation S386b may be performed subsequently.

In operation S386b, an operation of determining whether the node corresponds to a final bit may be performed. In a case where the node does not correspond to the final bit, in operation S381b, an operation of selecting another node may be performed subsequently, while in a case where the node corresponds to the final bit, in operation S387b, a CRC may be performed.

Figure 14:
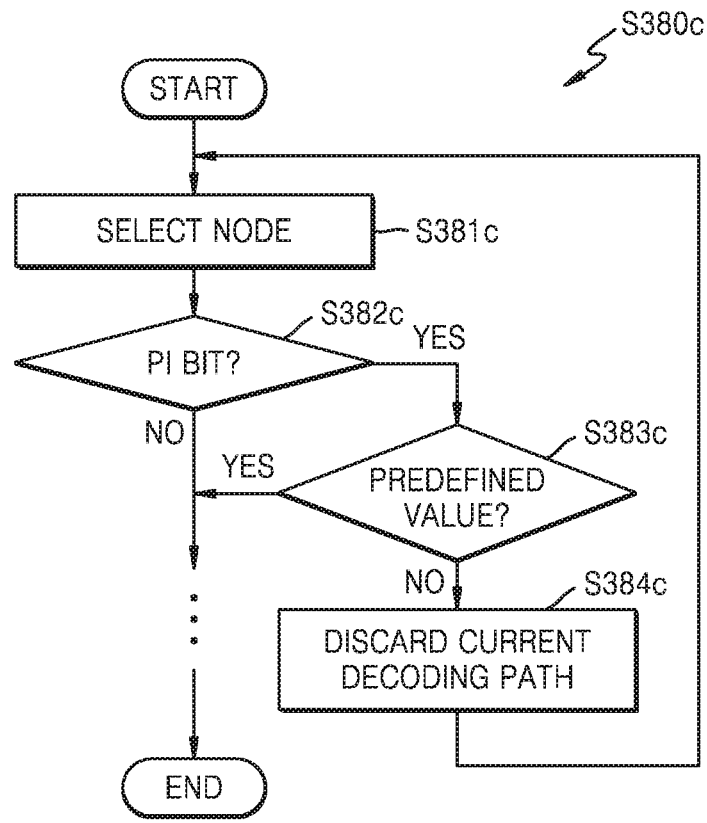
FIG. 14 is a flowchart illustrating an example of operation S380 of FIG. 3 in accordance with an example embodiment of the inventive concepts.

FIG. 14 is a flowchart illustrating an example of operation S380 of FIG. 3 in accordance with an example embodiment of the inventive concepts. As described above with reference to FIG. 3, in operation S380c of FIG. 14, channel decoding based on polar codes may be performed. In the example of FIG. 14, a PI bit may be used for list pruning. As shown in FIG. 14, operation S380c may include a plurality of operations (S381c to S384c). Operation S380c may further include additional operations desired for completing the decoding operation. Hereinafter, a description of FIG. 14 which is the same as descriptions of FIG. 11 and FIG. 13 will be omitted.

In operation S381c, an operation of selecting a node may be performed. Then, in operation S382c, an operation of determining whether the node corresponds to a PI bit may be performed. As shown in FIG. 14, in a case where the node is not the PI bit, i.e., a frozen bit or an information bit, subsequent operations for decoding may be performed, whereas in a case where the node is the PI bit, operation S383c may be performed subsequently.

In operation S383c, an operation of determining whether an estimated PI bit has a predefined (or alternatively, desired) value may be performed. As discussed above, the PI bit may have a value, e.g. a fixed value (e.g. zero) predefined (or alternatively, desired) in an encoder, or a unique value of a receiver (e.g., 20 of FIG. 1) including a decoder. The predefined (or alternatively, desired) value of the PI bit may be known in advance by the decoder. In a case where the estimated PI bit has the predefined (or alternatively, desired) value, subsequent operations for decoding may be performed. On the other hand, in a case where the estimated PI bit has a value different from the predefined (or alternatively, desired) value, a current decoding path may be discarded (operation S384c). That is, the PI bit may be used for list pruning in the decoder, and as a result, the decoding performance may be improved.

Figure 15:
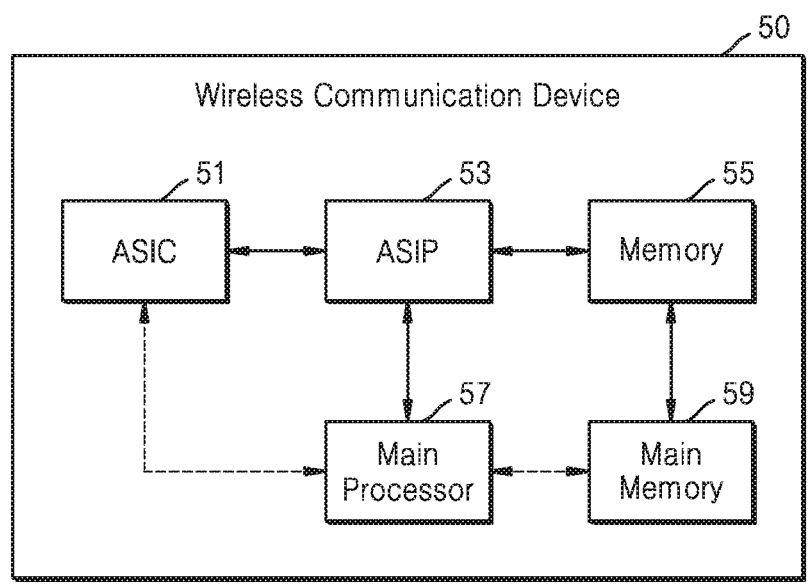
FIG. 15 is an example block diagram of a wireless communication device in accordance with an example embodiment of the inventive concepts.

FIG. 15 is an example block diagram of a wireless communication device 50 in accordance with an example embodiment of the inventive concepts. As shown in FIG. 15, the radio communication apparatus 50 may include an application specific integrated circuit (ASIC) 51, an application specific instruction set processor (ASIP) 53, a memory 55, a main processor 57, and a memory 59. Two or more of the ASIC 51, the ASIP 53, and the main processor 57 may communicate with each other. At least two of the ASIC 51, the ASIP 53, the memory 55, the main processor 57 and the main memory 59 may be embedded in one chip.

The ASIP 53 is an integrated circuit customized for a particular use and may support a dedicated instruction set for a particular application and execute instructions included in the instruction set. The memory 55 may communicate with the ASIP 53 and may store a plurality of instructions executed by the ASIP 53 as a non-volatile storage device. For example, the memory 55 may include, but is not limited to, any type of memory that is accessible by the ASIP 53 such as a random access memory (RAM), read only memory (ROM), tape, magnetic disk, optical disk, volatile memory, non-volatile memory, and a combination thereof.

The main processor 57 may control the wireless communication device 50 by executing a plurality of instructions. For example, the main processor 57 may control the ASIC 51 and the ASIP 53, and may process data received over a wireless communication network or process a user input to the wireless communication device 50. The main memory 59 may communicate with the main processor 57 and may store a plurality of instructions executed by the main processor 57 as a non-temporary storage device. For example, the main memory 59 may include, but is not limited to, any type of memory that is accessible by the main processor 57 such as a random access memory (RAM), read only memory (ROM), tape, magnetic disk, optical disk, volatile memory, non-volatile memory, and a combination thereof.

The encoding and/or decoding method according to the example embodiment of the inventive concepts described above may be performed by at least one of the components included in the wireless communication device 50 of FIG. 15. In some example embodiments, at least one of operations of the encoding and/or decoding method described above may be implemented as a plurality of instructions stored in the memory 55. In some example embodiments, the ASIP 53 may perform at least one of the operations of the encoding and/or decoding method by executing the plurality of instructions stored in the memory 55. In some example embodiments, at least one of the operations of the encoding and/or decoding method may be implemented in a hardware block designed through logic synthesis or the like and included in the ASIC 51. In some example embodiments, at least one of the operations of the encoding and/or decoding method may be implemented as a plurality of instructions stored in the main memory 59, and the main processor 57 may perform at least one of the operations of the encoding and/or decoding method by executing the plurality of instructions stored in the main memory 59.

As described above, the example embodiments have been disclosed in the drawings and specification. However, it should be understood that the terms have been used only for the purpose of describing the technical idea of the inventive concepts and not for limiting the scope of the inventive concepts as defined in the claims. Therefore, those skilled in the art will appreciate that various modifications and variations of the disclose example embodiments are possible without departing from the scope of the inventive concepts. Accordingly, the true scope of protection of the inventive concepts should be determined by the technical idea of the appended claims.

What is claimed is:

1. A method of encoding input data as a polar code, the method comprising:
   generating unfrozen bits by adding at least one information bit to information bits generated based on the input data, the at least one information bit having a value known to both of an encoder and a decoder;
   reordering the unfrozen bits and frozen bits by assigning the unfrozen bits to first polarized sub-channels having a reliability higher than a first level, and by assigning the frozen bits to second polarized sub-channels having a reliability lower than the first level, values of the frozen bits being known to both of the encoder and the decoder; and
   generating a code word by polar-coding results of the reordering.

2. The method of claim 1,
   wherein a polar code tree comprises Rate-1 nodes having only the unfrozen bits as child nodes and Rate-R nodes having both the frozen bits and the unfrozen bits as child nodes, and
   wherein the reordering comprises assigning the at least one information bit to a polarized sub-channel having a highest reliability among leaf nodes of the Rate-1 nodes or the Rate-R nodes.

3. The method of claim 2, wherein the assigning comprises assigning the at least one information bit to at least one leaf node having a lowest index among candidate indices associated with the Rate-1 nodes or the Rate-R nodes.

4. The method of claim 2, further comprising:
   rate matching by puncturing or shortening the code word,
   wherein the assigning comprises assigning the at least one information bit to a specific polarized sub-channel, from among a plurality of polarized sub-channels, that does not correspond to punctured or shortened bit in the rate matching.

5. The method of claim 1,
   wherein the information bits comprise input bits and cyclic redundancy check (CRC) bits, and
   wherein the reordering further comprises assigning the input bits and the CRC bits to some of the polarized sub-channels to which the at least one information bit is not assigned.

6. The method of claim 5, wherein the assigning the input bits and the CRC bits comprises interleaving the CRC bits with the input bits.

7. The method of claim 5, further comprising:
   determining a number of the at least one information bit according to a false alarm rate and a number of the CRC bits.

8. The method of claim 1, further comprising:
   transmitting the code word onto a physical control channel of a wireless communication system,
   wherein the transmitting comprises omitting transmission of wireless resource allocation information of the code word.

9. The method of claim 1, wherein the at least one information bit has a fixed value or a unique identifier of the decoder.

10. An apparatus for encoding input data as a polar code, the apparatus comprising:
    a memory configured to store computer-readable instructions; and
    one or more processors configured to execute the computer-readable instructions such that the one or more processors are configured to,
       generate a bit sequence by reordering unfrozen bits and frozen bits based on reliability of polarized sub-channels, the unfrozen bits including at least one information bit having a value known to both of an encoder and a decoder and information bits based on the input data, the frozen bits having values known to both of the encoder and the decoder; and
       generate a code word by polar-coding the bit sequence.

11. The apparatus of claim 10, wherein the one or more processors are further configured to receive the information bits and generate the unfrozen bits by adding the at least one information bit to the information bits.

12. The apparatus of claim 10,
    wherein a polar code tree comprises Rate-1 nodes having only the unfrozen bits as child nodes and Rate-R nodes having both the frozen bits and the unfrozen bits as child nodes, and
    wherein the one or more processors are further configured to assign the at least one information bit to a polarized sub-channel having a highest reliability among leaf nodes of the Rate-1 nodes or the Rate-R nodes.

13. A decoding method comprising:
    receiving a code word generated by polar encoding a bit sequence; and
    performing list decoding of the code word by generating a list of L decoding paths in a case where L is a positive integer,
    wherein the bit sequence comprises unfrozen bits including input bits, cyclic redundancy check (CRC) bits, and at least one information bit, and frozen bits having values known to both of an encoder and a decoder, the at least one information bit having a first value known to both of the encoder and the decoder, and wherein the performing the list decoding of the code word comprises early terminating the list decoding of the code word based on a result of decoding the at least one information bit.

14. The decoding method of claim 13, wherein the performing the list decoding of the code word comprises:

determining a type of a node based on a level of a code tree according to each of the L decoding paths; and determining early termination according to whether a second value decoded by the node and the first value of the at least one information bit are identical, in response to the type of the node corresponding to the at least one information bit.

15. The decoding method of claim 14, wherein the determining the early termination comprises determining the early termination of the list decoding of the code word in response to a third value obtained by decoding the at least one information bit for all of the L decoding paths not being identical to the first value of the at least one information bit.

16. The decoding method of claim 14, wherein the unfrozen bits comprises a plurality of designated information bits, and wherein the determining the early termination comprises determining the early termination of the list decoding of the code word in response to a decoding path in which all of values obtained by decoding the plurality of information bits are identical to the first value of the at least one information bit not occurring among the L decoding paths.

17. The decoding method of claim 14, wherein the performing the list decoding of the code word further comprises performing list pruning, in response to the type of the node being an input bit.

18. The decoding method of claim 14, wherein the performing the list decoding of the code word further comprises performing list pruning, in response to the type of the node being an unfrozen bit.

19. The decoding method of claim 14, wherein the performing the list decoding of the code word further comprises discarding a decoding path in which a decoded value corresponding to the at least one information bit is not identical to the first value of the at least one information bit.

20. The decoding method of claim 13, wherein the performing the list decoding of the code word further comprises performing a CRC on a decoding path in response to reaching a final bit in the decoding path.

* * * * *